United States Patent
Luan et al.

(10) Patent No.: US 10,535,657 B2
(45) Date of Patent: Jan. 14, 2020

(54) HIGH DENSITY VERTICAL THYRISTOR MEMORY CELL ARRAY WITH IMPROVED ISOLATION

(71) Applicant: Kilopass Technology, Inc., San Jose, CA (US)

(72) Inventors: Harry Luan, Saratoga, CA (US); Valery Axelrad, Woodside, CA (US)

(73) Assignee: TC Lab, Inc., Gilroy, CA (US)

( * ) Notice: Subject to any disclaimer, the term of this patent is extended or adjusted under 35 U.S.C. 154(b) by 0 days.

(21) Appl. No.: 15/683,760

(22) Filed: Aug. 22, 2017

(65) Prior Publication Data
US 2018/0053766 A1 Feb. 22, 2018

Related U.S. Application Data

(60) Provisional application No. 62/378,098, filed on Aug. 22, 2016.

(51) Int. Cl.
| | | |
|---|---|---|
| H01L 27/102 | (2006.01) | |
| H01L 21/8229 | (2006.01) | |
| H01L 27/108 | (2006.01) | |
| H01L 27/11512 | (2017.01) | |
| G11C 15/04 | (2006.01) | |
| H01L 29/66 | (2006.01) | |
| G11C 11/39 | (2006.01) | |
| H01L 27/08 | (2006.01) | |

(52) U.S. Cl.
CPC .......... *H01L 27/1027* (2013.01); *G11C 11/39* (2013.01); *G11C 15/04* (2013.01); *H01L 21/8229* (2013.01); *H01L 27/108* (2013.01); *H01L 27/10823* (2013.01); *H01L 27/10844* (2013.01); *H01L 27/11512* (2013.01); *H01L 29/66371* (2013.01); *H01L 27/0817* (2013.01)

(58) Field of Classification Search
CPC ............. H01L 27/1027; H01L 29/0649; H01L 21/8229; H01L 27/10823; H01L 27/11512; H01L 29/66371
See application file for complete search history.

(56) References Cited

U.S. PATENT DOCUMENTS

| | | | | |
|---|---|---|---|---|
| 2013/0306983 | A1* | 11/2013 | Nakano | H01L 29/0623 257/76 |
| 2014/0145238 | A1* | 5/2014 | Mariani | H01L 29/66363 257/107 |
| 2015/0255323 | A1* | 9/2015 | Jimma | H01L 21/764 257/315 |
| 2016/0093356 | A1* | 3/2016 | Luan | G11C 11/39 365/180 |
| 2016/0293618 | A1* | 10/2016 | Namkoong | H01L 29/42344 |
| 2017/0170288 | A1* | 6/2017 | Kiyosawa | H01L 21/3247 |

* cited by examiner

*Primary Examiner* — Lex H Malsawma
*Assistant Examiner* — Gardner W. S. Swan
(74) *Attorney, Agent, or Firm* — Aka Chan LLP

(57) ABSTRACT

Isolation between vertical thyristor memory cells in an array is improved with isolation regions between the vertical thyristor memory cells. The isolation regions are formed by electrically isolating cores surrounded by insulating material, such as silicon dioxide, in trenches between the memory cells. The electrically isolating cores may be tubes of air or conducting rods. Methods of constructing the isolation regions in a processes for manufacturing vertical thyristor memory cell arrays are also disclosed.

6 Claims, 10 Drawing Sheets

CMP, recess, and Hard mask removal.

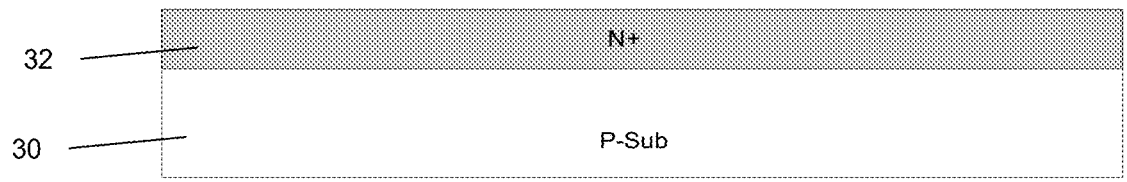
Figure 3A (A~A')
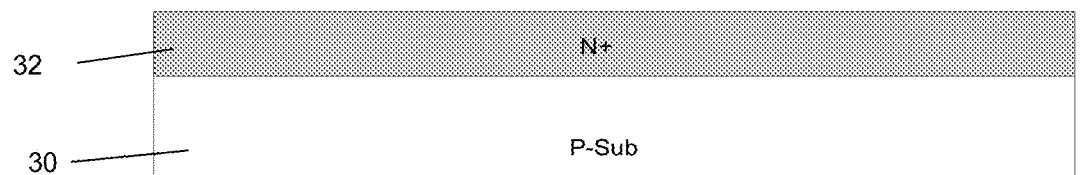
Figure 3B (B~B')
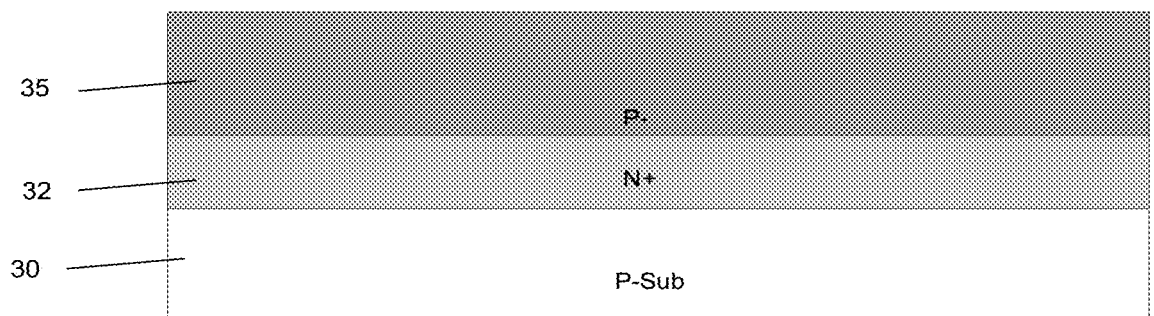
Figure 4A (A~A')
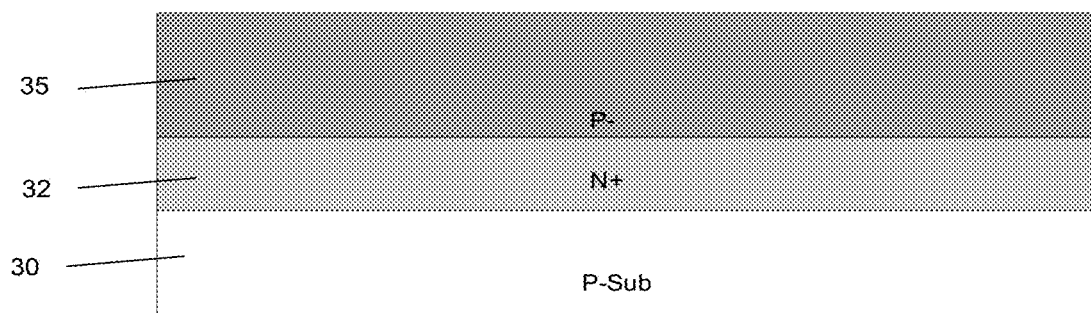
Figure 4B (B~B')

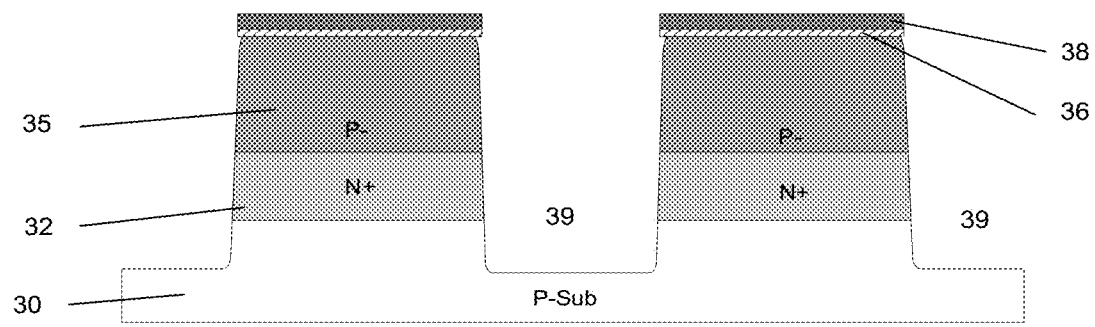
Figure 5A (A~A')
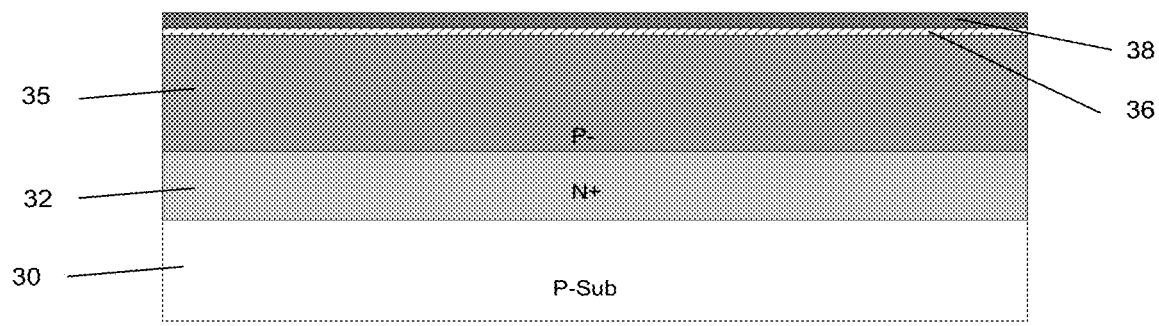
Figure 5B (B~B')
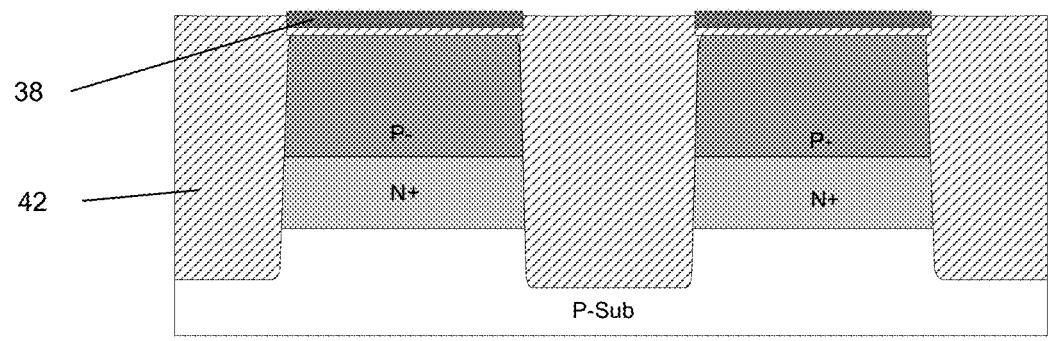
Figure 6A (A~A')
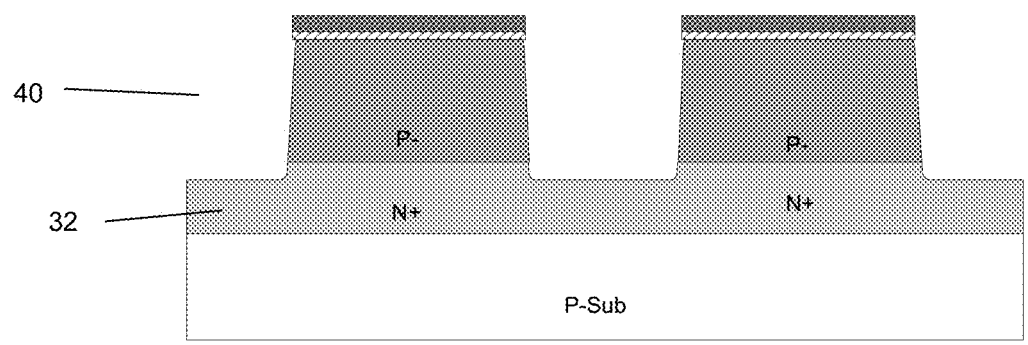
Figure 6B (B~B')

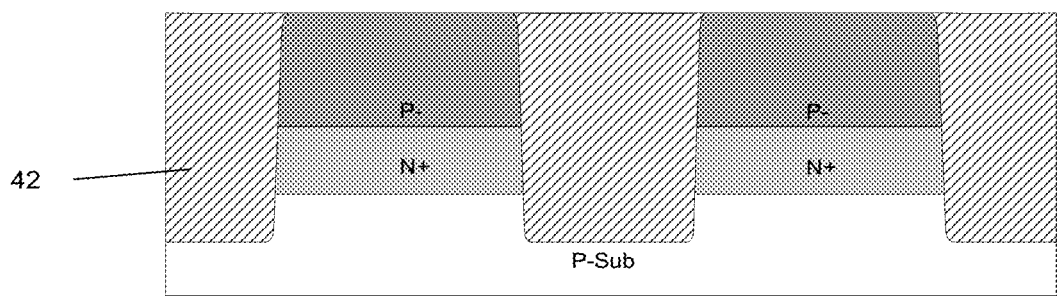
Figure 7A (A~A')
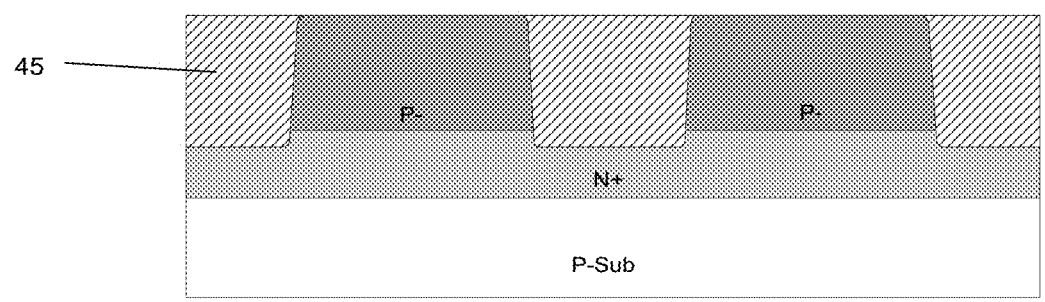
Figure 7B (B~B')
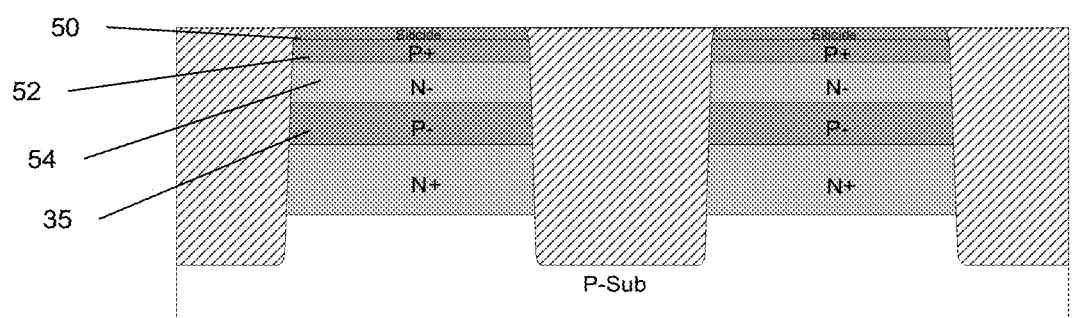
Figure 8A (A~A')
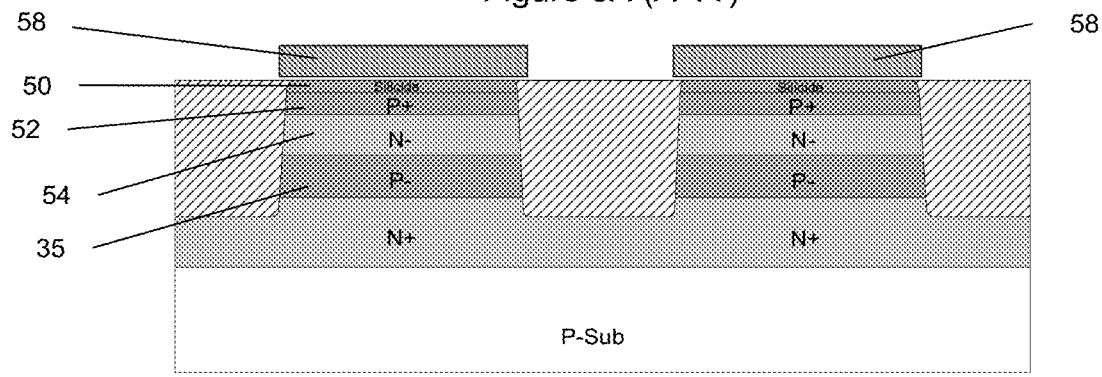
Figure 8B (B~B')

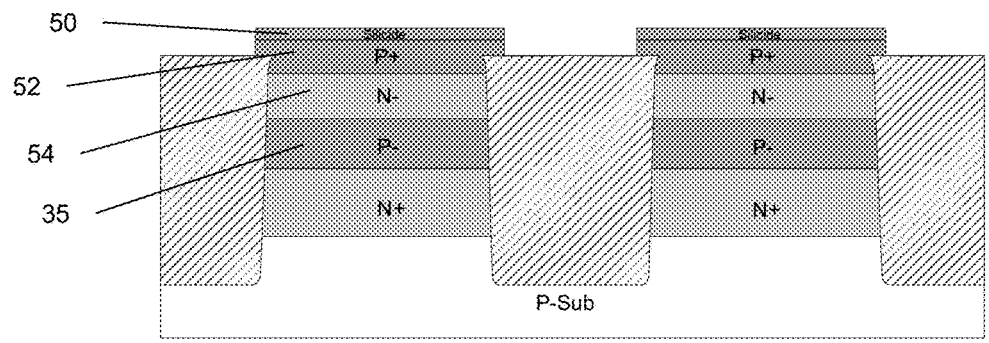
Figure 9A (A~A')
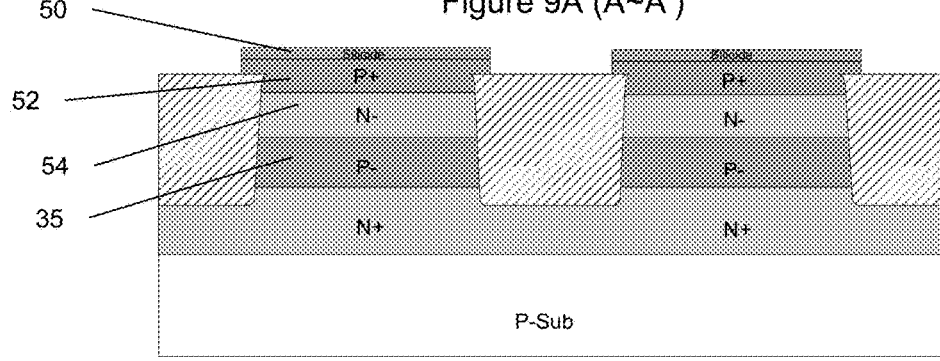
Figure 9B (B~B')
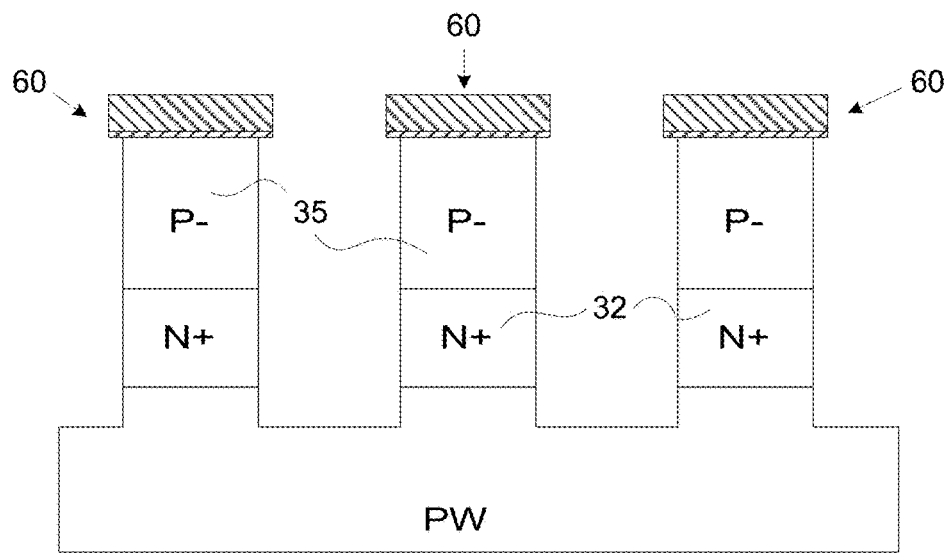
Isotropic silicon etch so that silicon under the hard mask is under cut
Figure 10A Non-conformal deposition of silicon oxide insulator Non-conformal deposition of silicon oxide insulator such that the openings are completely closed CMP and recess of the silicon oxide. Hard mask removal.

Silicon trench etch and liner oxidation

Sacrificial material deposition and etch back

Silicon oxide spacer deposition and etch

Sacrificial material removal by wet or dry isotropic etch

Non-conformal oxide deposition

CMP, recess, and Hard mask removal.

HIGH DENSITY VERTICAL THYRISTOR MEMORY CELL ARRAY WITH IMPROVED ISOLATION

CROSS-REFERENCE TO RELATED APPLICATIONS

This patent application claims priority to U.S. Provisional Patent Application No. 62/378,098, entitled, "Vertical Thyristor Air Gap Isolation for High-Density Memories," and filed Aug. 22, 2016.

BACKGROUND OF THE INVENTION

This invention relates to semiconductor devices for information storage. In particular, it relates to vertical thyristors for use in static (SRAM) and dynamic random access memories (DRAM).

Semiconductor thyristor structures for SRAMs and DRAMs, and the processes for manufacturing them are described in several co-pending patent applications commonly assigned to the present assignee. See, e.g. U.S. patent application Ser. No. 14/590,852, entitled "Cross-Coupled Thyristor SRAM Semiconductor Structures and Methods of Fabrication," issued as U.S. Pat. No. 9,613,968 on Apr. 4, 2017, which is incorporated herein by reference.

Various memory cell designs have been proposed based on the negative differential resistance behavior of a PNPN thyristor. An active or passive gate is often used in these designs for trade-offs among switching speed, retention leakage, or operation voltage. As the size of thyristor memory array cells becomes smaller, the isolation regions between adjoining memory cells also become smaller, reducing the extent of the electrical isolation provided by those regions. In closely spaced thyristors there is the possibility of adjoining cells interfering with each other through capacitive coupling, particularly if they are biased in opposite states. This interference can degrade the performance of the memory array, and in extreme cases even change the state of one of the thyristors.

This invention provides improved isolation between vertical thyristors to reduce cell interference by providing an air gap or a metal conductive shield between the thyristors, thus increasing memory array stability.

BRIEF SUMMARY OF THE INVENTION

The present invention provides for an integrated circuit having an array of vertical thyristor memory cells in a semiconductor substrate with each vertical thyristor memory cell separated from other vertical thyristor memory cells by isolation regions. Each isolation region comprises a trench; an electrically isolating core in the trench; and insulating material surrounding the electrically isolating core. The isolation region electrically isolates the vertical thyristor memory cell from interference by operations of neighboring memory cells. The electrically isolating core may comprise an air tube along the trench or a conducting rod along the trench.

The present invention also provides for an integrated circuit having a semiconductor substrate. The integrated circuit comprises: a first thyristor having a vertically stacked P-conductivity type anode, N-conductivity type base, P-conductivity type base, and N-conductivity type cathode provided by the semiconductor substrate; a second thyristor having a vertically stacked P-conductivity type anode, N-conductivity type base, P-conductivity type base, and N-conductivity type cathode provided by the semiconductor substrate; and an isolation region separating the first thyristor from the second thyristor. The isolation region includes a trench extending into the semiconductor substrate below a junction region between the P-conductivity type base and the N-conductivity type cathode of each of the first and second thyristors; an electrically isolating core in the trench; and insulating material surrounding the electrically isolating core so that the isolation region electrically isolates the first and second thyristors from interference by operation of the other thyristor. The electrically isolating core may comprise an air tube along the trench or an electrically conducting rod along the trench.

The present invention further provides for a method of manufacturing a memory cell array of vertical thyristors memory cell array in a semiconductor substrate. The method comprises etching a trench between vertical thyristor memory cells and depositing insulating material non-conformally over the trench, the insulating material covering an electrically isolating core in the trench. The electrically isolating core and the insulating material in the trench isolates the vertical thyristor memory cells on one of the trench from the vertical thyristor memory cells on the other side of the trench. The electrically isolating core can comprise air or a conducting material.

Other objects, features, and advantages of the present invention will become apparent upon consideration of the following detailed description and the accompanying drawings, in which like reference designations represent like features throughout the figures.

BRIEF DESCRIPTION OF THE DRAWINGS

FIGS. 3A-9A are cross-sectional views illustrating a process flow for manufacturing the vertical thyristor memory cells showing cross-sectional views along line A~A' of FIG. 2B;

FIGS. 3B-9B are cross-sectional views illustrating the process flow for manufacturing the vertical thyristor memory cells showing the cross-section views along line B~B' of FIG. 2B.

FIGS. 10A-10D are cross-sectional views to illustrate the steps of forming electrically insulating air gaps between neighboring vertical thyristor memory cells in FIG. 2, according to one embodiment of the present invention.

DETAILED DESCRIPTION OF THE INVENTION

Figure 1:
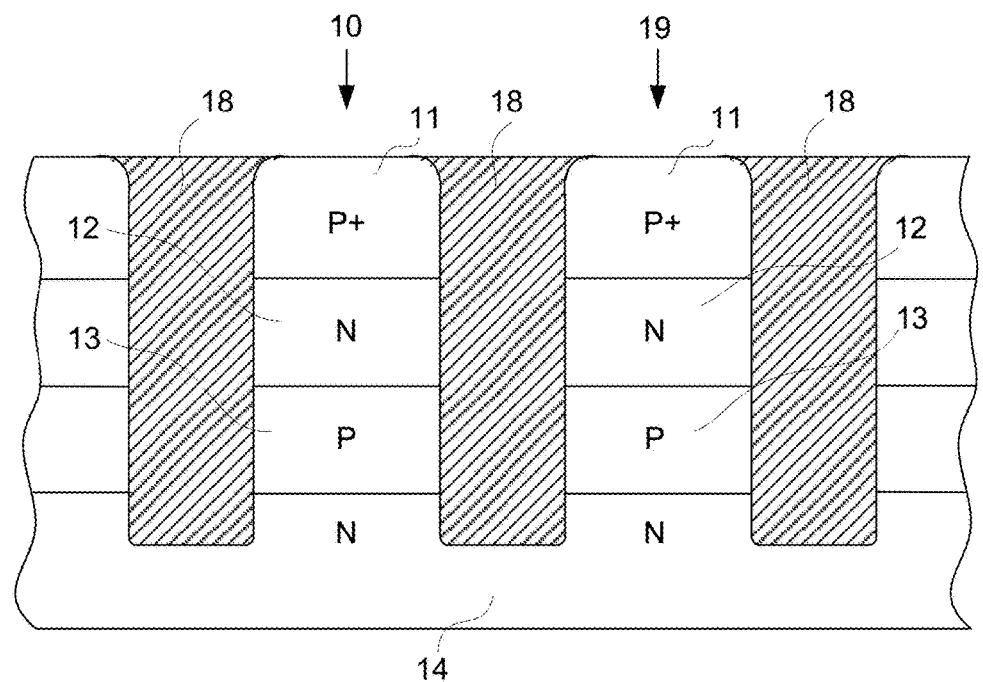
FIG. 1 is a representation of a portion of an array of vertical thyristor memory cells in a cross-sectional view of an integrated circuit, according to one embodiment of the present invention.

FIG. 1 is a representational cross-sectional diagram of a portion of a vertical thyristor memory cell array in an integrated circuit. Two neighboring and complete vertical thyristor memory cells 10, 19 are shown. The memory cells 10, 19 are closely spaced and separated by intervening isolation regions 18. Each of the memory cells 10, 19 is formed by a vertical thyristor having a P-conductivity type anode region 11, an N-type base region 12, a P-type base region 13, and an N-type cathode 14 region which is common to both transistors 10, 19. Isolation regions 18 separate and electrically isolate of each of the vertical thyristor memory cells 10, 19 of the array, and are as narrow as possible to improve the packing density of the memory cell array. In a typical memory array operation, one thyristor 10, for example, can have an anode at 2.5 volts, with the other thyristor 19 having an anode at 0.6 volts. Under such biasing, the isolation region 18 between the cells 10, 19 which are typically formed by a single insulating material, such as silicon dioxide, may not be sufficient to electrically isolate the memory cells 10, 19 from each other. In such a case, one memory cell in the array may interfere with the operations of its neighboring memory cells.

Figure 2A:
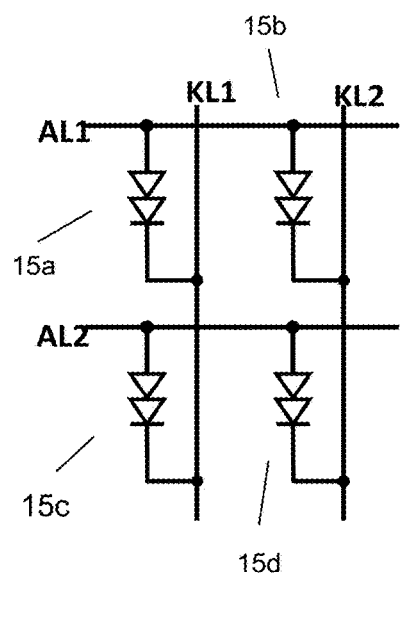
FIG. 2A is a circuit diagram of a 2×2 thyristor memory cell array, including memory cells which comprise vertical thyristors.

FIG. 2A is a circuit diagram of a portion of a representative thyristor memory cell array. Each memory cell is formed by a thyristor. In this example four thyristors 15a, 15b, 15c, and 15d are coupled in a grid pattern to form a 2×2 array. A typical memory cell array has many more memory cells. The thyristors 15a and 15b are connected to the same row line AL1, but to different column lines KL1 and KL2 respectively. Similarly, thyristors 15c and 15d are connected to the same row line AL2, but to different column lines KL1 and KL2 respectively. Of course, it should be understood the rows and columns are arbitrary directions used to facilitate the reader's understanding.

Figure 2B:
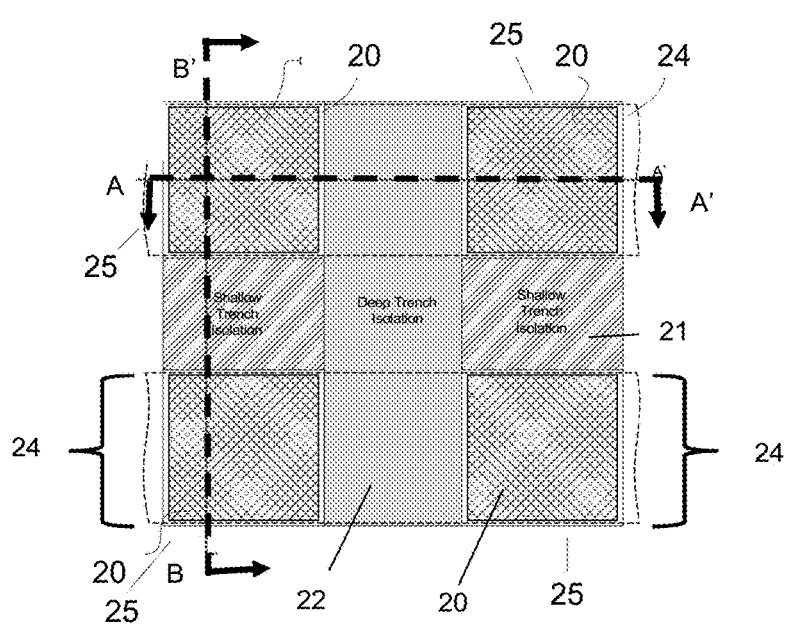
FIG. 2B is a layout diagram for the FIG. 2A circuit diagram showing the topology of a 2×2 memory cell array as implemented in an integrated circuit.

FIG. 2B is an integrated circuit layout diagram illustrating an implementation of the circuit shown in FIG. 2A. The four thyristors 25 are vertical (i.e., aligned perpendicularly to the plane of the drawing), each having an anode 20 at a corners of the layout. Each thyristor represents a memory cell of the array. A deep silicon dioxide trench 22 (shown vertically in the drawings) isolates the thyristors on the left from those on the right, while a shallower silicon dioxide trench 21 (shown horizontally in the drawings) isolates the upper thyristors from the lower ones. These trenches are shown below in more detail. A conductive line 24 as outlined by a dotted line provides a row line for the memory array, and is coupled to the anodes of the thyristors. A similar row line (also outlined by a dotted line) extends across the anodes of the thyristors in the row above row line 24. The conductive row lines 24 correspond to row lines AL1 and AL2 in FIG. 2A. The figure also shows the locations of cross-sections A~A' and B~B' used in subsequent figures below.

FIGS. 3A, 3B to 9A, 9B illustrate a process flow for the manufacturing the vertical thyristor memory cell array of FIG. 2B and provides a background and context for the present invention. FIGS. 3A and 3B illustrate the beginning of the process flow for fabricating the structure shown in the FIG. 2B top view. In the first step of the process flow selected regions of a P-conductivity type silicon substrate 30 are doped with an N-conductivity type dopant, for example, arsenic, to a concentration that ranges from $1\times10^{19}$ to $5\times10^{20}$ dopants/$cm^3$. The semiconductor substrate layer 30 can include single crystalline semiconductor materials, such as silicon or silicon-germanium alloy. The N-conductivity type dopant 32 is introduced by well known semiconductor fabrication techniques, for example, ion implantation, and extends into the substrate 30 as illustrated to a depth of 200 nm~500 nm. Because the entire cell array region is open to this buried N-type doping, there is no difference between the two cross-sectional views of FIGS. 3A and 3B.

Next, as shown in FIGS. 4A and 4B, an epitaxial silicon layer 35 with a thickness between about 300 nm and 500 nm is formed on top of the underlying structure, also using well-known semiconductor fabrication process technology. The epitaxial layer 35 can be either intrinsic, or in-situ doped to a P-conductivity type.

FIGS. 5A and 5B illustrate the next steps of the process flow. First, a thin silicon dioxide (pad) layer 36 is grown or deposited across the upper surface of the semiconductor structure. On top of the layer 36, a silicon nitride layer 38 is formed using well-known process technology. Using a mask (not shown), openings are etched through the silicon nitride layer 38 and the pad oxide layer 36 to expose the upper surface of the epitaxial layer 35 where deep trenches 39 are to be formed. The deep trenches 39 correspond to the deep trenches 22 of FIG. 2B. Using the patterned pads as a hard mask with or without photoresist removal, a reactive ion etch (RIE) step is then performed to etch the deep trenches 39 that extend through the memory cell area, e.g., as shown in the top view of FIG. 2B. These deep trenches extend down through the overlying layers to the substrate 30. Notice that the deep trenches are parallel to each other and thus do not appear in the cross-section illustrated in FIG. 5B.

As next shown in FIG. 6A, the deep trenches 39 are filled with insulating material such as silicon dioxide 42. This is achieved by first growing a thin liner-oxide on the exposed silicon surface of the sidewalls and bottoms of the trenches. Then using, for example, high-density plasma (HDP) enhanced chemical vapor deposition (CVD), the trenches are filled with silicon dioxide to an appropriate thickness, typically extending above the upper surface of the structure. Next, well-known chemical mechanical polishing (CMP) with high-selectivity slurry is used to planarize the surface and remove the excess trench oxide down to the pad nitride. Then, as shown in FIG. 6B, another masking step is performed and shallower trenches 40 are etched. The shallower trenches 40 correspond to the shallower trenches 21 of FIG. 2B. Note that the depth of the shallower trenches 40 extends to the N-conductivity type epitaxial layer 32, and not down to the P-type substrate.

Next, as shown in FIG. 7B, the shallower trench 40 is oxidized and then filled with silicon dioxide 45, in the same manner as described above with respect to the deep trench 39. After the trench 40 is filled with silicon dioxide and planarized by CMP, the upper layers of silicon dioxide and silicon nitride are etched away, again using conventional wet or dry etching. The silicon dioxide insulating material 42 in the deep trenches 39 (FIG. 6A) and silicon dioxide insulating material 45 in the shallower trenches 40 (FIG. 7B) provide the electrical isolation around the vertical thyristor of each of the memory cells of the array. The trenches 39 and 40 filled with insulating silicon dioxide material 42 and 45 are the isolation regions 18 between described earlier with respect to FIG. 1.

The process flow continues to complete the elements of the vertical thyristors of the memory cell array with FIGS. 8A and 8B illustrating the next steps. Ion implantation steps are used to introduce P-conductivity type 52 and N-conductivity type 54 impurities into the upper surface of the semiconductor creating the PNPN thyristor structure. The N-conductivity type impurity is preferably arsenic, while the P-conductivity type impurity is preferably boron, e.g. boron difluoride. After formation of region 52, a refractory metal, such as titanium, cobalt, or nickel, is deposited on to the upper surface. A rapid-thermal anneal (RTP) is then performed to create a conductive metal silicide in semiconductor regions such as region 50 to provide an ohmic contact to the anode 50 of the thyristor. The un-reacted metal is then removed by a wet etch. The buried N-type region 32 provides the cathode connection.

Also shown in FIG. 8B are conducting lines 58 which provide the row lines connecting the anodes of the thyristors of a row. These conductors that can be metal, metal silicide or doped polysilicon are formed using well-known semiconductor fabrication techniques. For simplicity the row line conductors are only shown in FIG. 8B, and not in subsequent figures here.

FIGS. 9A and 9B illustrate an alternative embodiment for the anode structure 56. As shown, a raised source/drain technology can be used to form the anode by selective epitaxial growth of silicon on the upper surface of the structure. This P-type region 52 can be doped in-situ or using a masking and implantation step. As per the previous embodiment, a refractory metal and an annealing step can be used to form the anode electrode. The raised source/drain technology provides the advantage of allowing a shallower trench, yet still enabling additional space for the N– and P– regions 54 and 35 respectively.

The trenches 39 and 40 (FIGS. 5A and 6B) and the trench-filling insulating material 42 and 45 (FIGS. 6A and 7B) represent the isolation regions of FIG. 1 for the vertical thyristor memory cell array. As noted earlier, there is the possibility that the silicon dioxide insulating materials 42 and 45 might not provide sufficient electrical isolation as the dimensions of the array are shrunk and that undesirable interference between memory cells might occur.

Figure 10B:
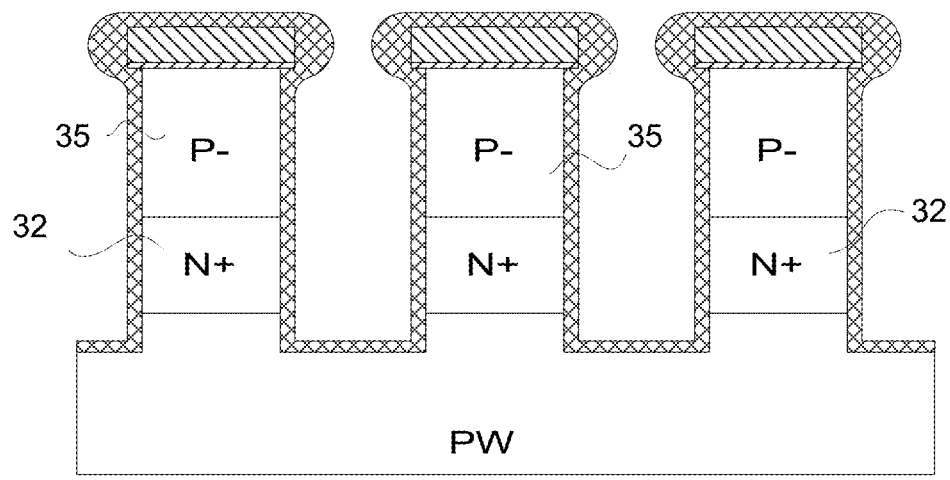
Figure 10C:
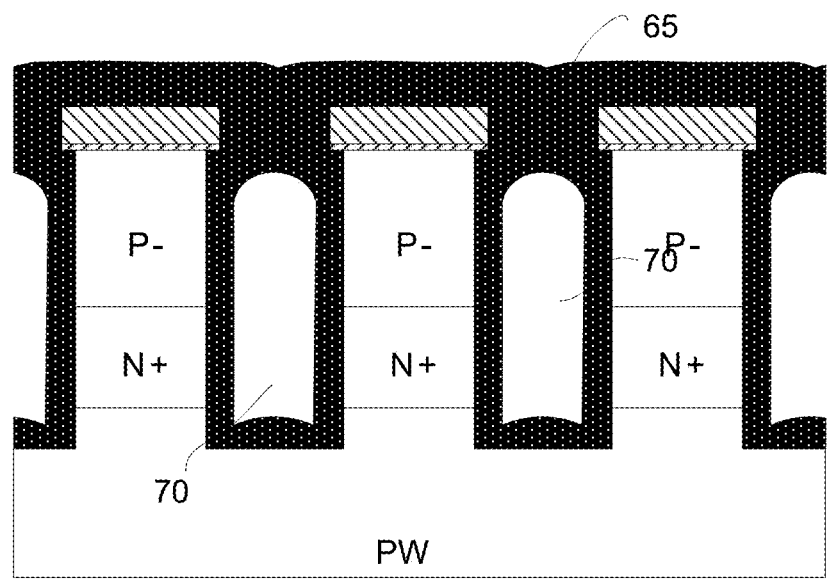
Figure 10D:
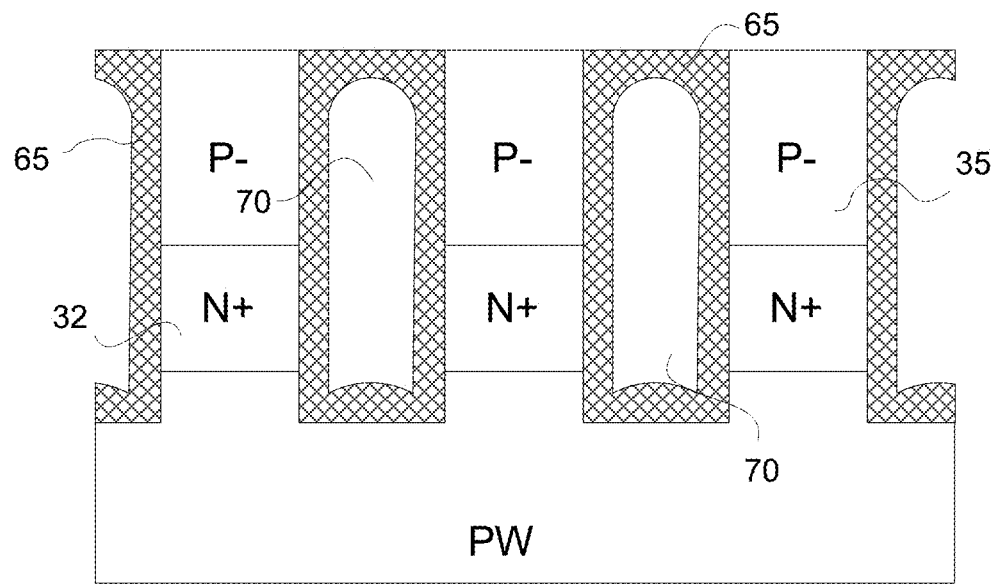

To improve the isolation between the memory cells, rather filling the trenches 39 and 40 completely with an insulating material, an air gap is provided in each of the trenches, according to one embodiment of the present invention. An air gap can be formed using various known semiconductor manufacturing processes. In one embodiment the trenches are etched such that the silicon is undercut with the hard mask/pad oxide 60 defining the trenches overhanging both sides of the etched trenches, as shown in FIG. 10A. This is followed by a silicon dioxide deposition process with poor step coverage, an example of which is conventional plasma-enhanced chemical vapor deposition (PECVD), shown in FIG. 10B. Due to the trench shape and also to the faster deposition rate at the top, air gaps 70 are intentionally created inside the trenches, as illustrated in FIG. 10C. The air gaps 70 form air tubes in the trenches. FIG. 10D shows the planarization results of a CMP step and removal of the hard mask on the structure of FIG. 10C.

Figure 11A:
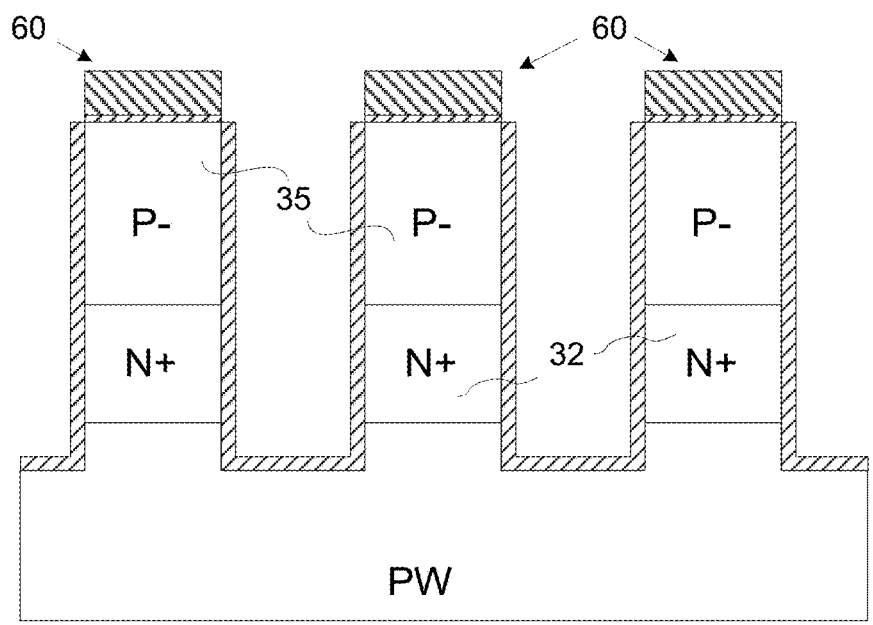
FIG. 11A-11F are cross-sectional views to illustrate the steps of forming an electrically insulating air gaps between neighboring vertical thyristor memory cells in FIG. 2, according to another embodiment of the present invention.
Figure 11B:
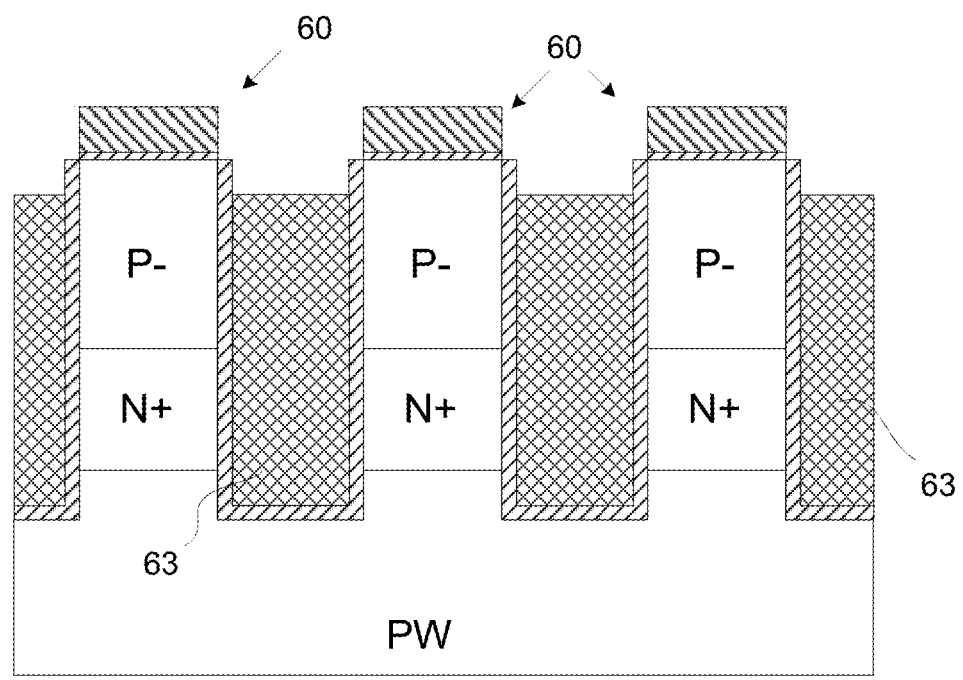
Figure 11C:
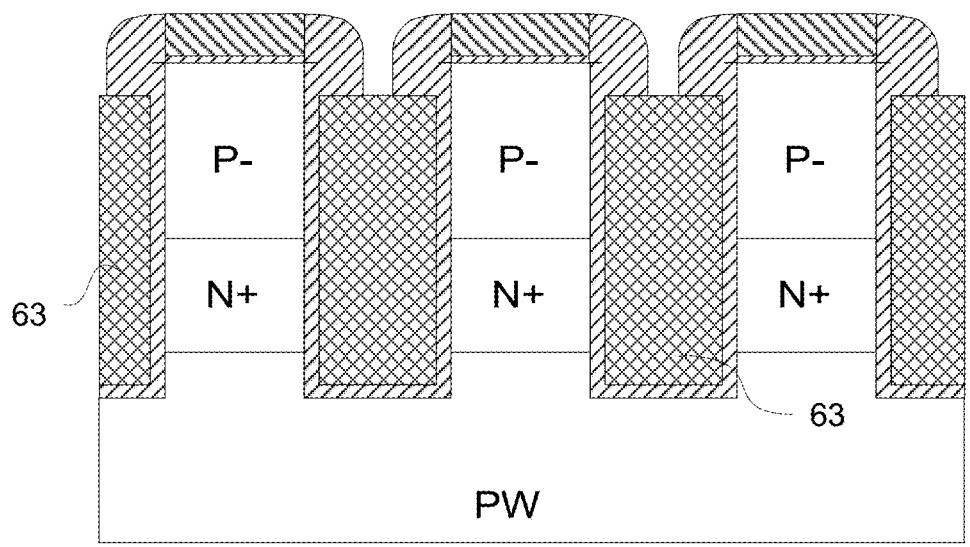
Figure 11D:
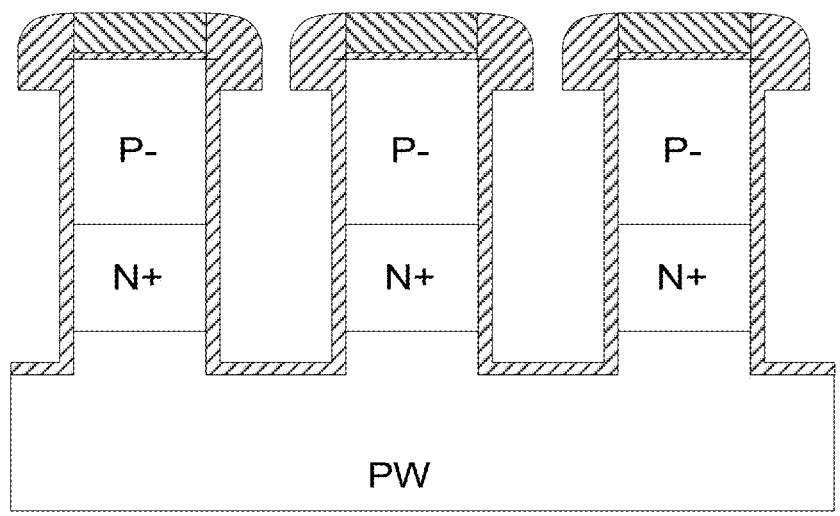
Figure 11E:
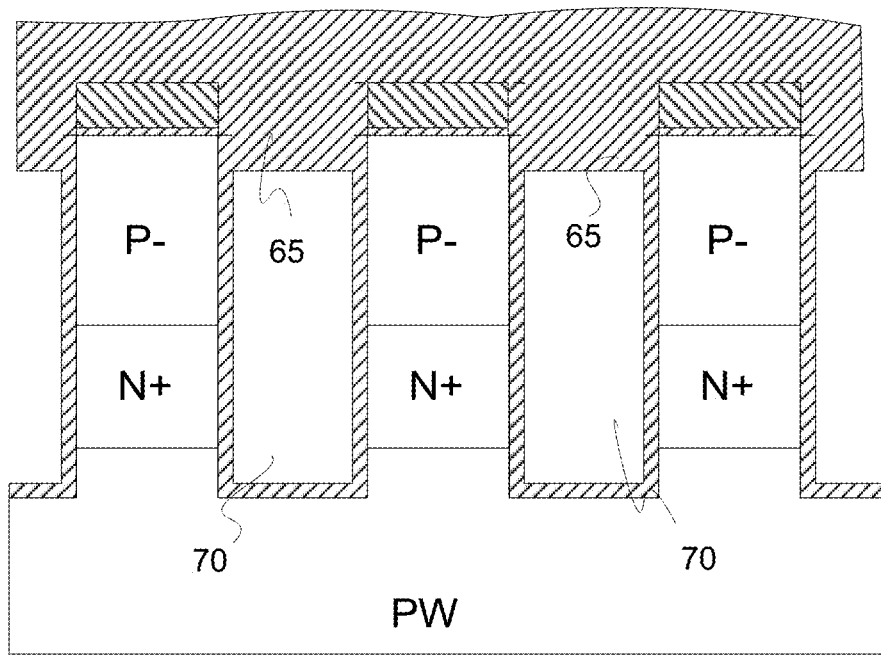
Figure 11F:
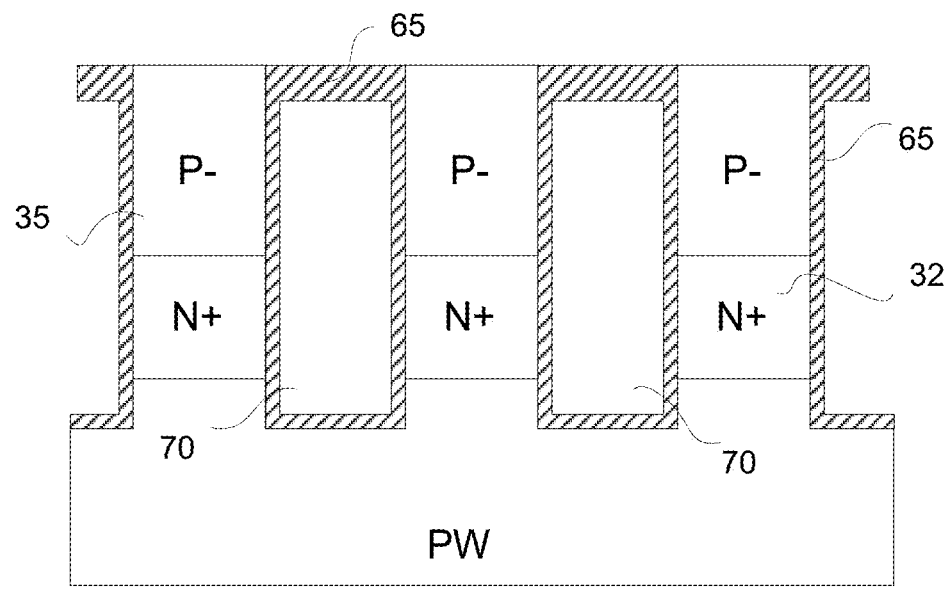

As yet another embodiment, a sacrificial material fill and spacer method can be used to create the air gaps in a more controlled manner. Starting with the structure shown in FIG. 11A which has a oxide layer lining an etched trench, a sacrificial material 63, such as polysilicon, carbon, etc., is deposited and dry etched such that its top surface is below the hard mask/pad oxide 60 interface about 10 nm to 50 nm, shown in FIG. 11B. This is followed by a conformal deposition and anisotropic etch of an oxide film which forms the spacers along all sides of the trench openings (FIG. 11C). After removing the sacrificial material with isotropic wet or dry etching, the trenches have a shape with much narrower openings at the top (FIG. 11D) and any of the CVD methods can then create the structure shown in FIG. 11E. The structure in FIG. 11F is formed by a CMP step with removal of the hard mask to planarize the silicon dioxide layer left by the CVD step.

The result is that silicon dioxide 65 fills the deep trenches 39 with the air gap 70 trapped within the deep trenches. A similar set of operations are then performed after the shallow trenches 40 are etched. The shallow trenches 40 are filled by insulating silicon dioxide with a trapped air gap as previously described. At this point the process flow is equivalent or nearly equivalent to the process flow stage earlier described and represented by FIG. 7B. In this manner, the vertical thyristor memory cells are insulated from each other by isolation regions formed with air gaps, tunnels of air surrounded by silicon dioxide in the trenches.

Figure 12:
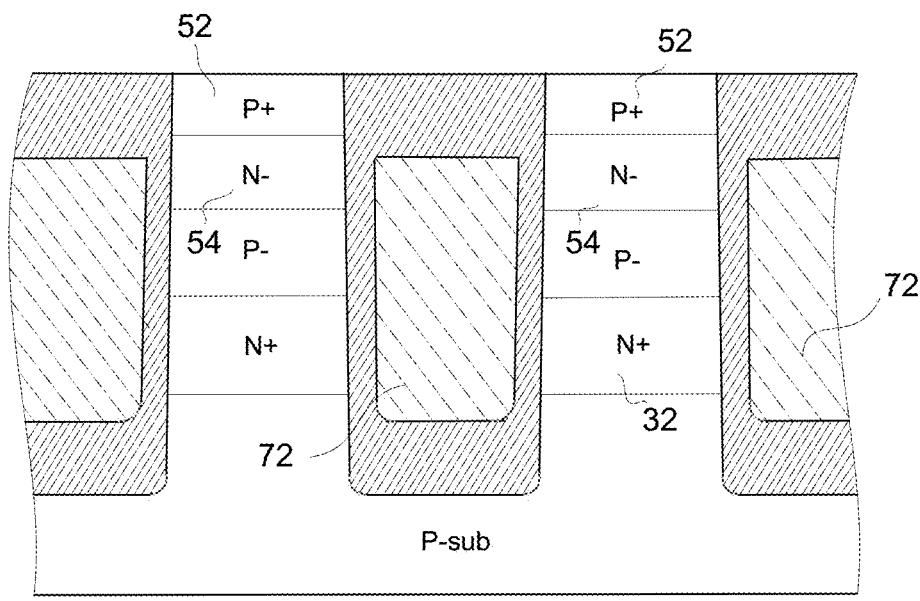
FIG. 12 is a representation of the partially formed vertical thyristor memory cell with electrically insulating metal rod between neighboring vertical thyristor memory cells in FIG. 2, according to still another embodiment of the present invention.

Another embodiment of the present invention provides for a conducting plate substituted for the air gap with many of the same process steps earlier described. The conducting plate, a cross-section of a conducting rod, is electrically grounded by connection along a location along the trench in which the conducting rod sits. To manufacture the conducting plate, silicon dioxide is again grown conformally on the sides and bottom of the deep etched trenches 39 and a sidewall oxidation process is performed to cover the sides of the trenches 39. Following that step, a conducting material 72, such as doped polysilicon, metals including tungsten and cobalt, or alloys including molybdenum-tungsten, titanium-tungsten, is deposited and recessed in the trench. The conducting material 72 appearing as a field plate in cross-section is part of a conducting rod in the deep trenches 39. The conducting material can be deposited using one of the well-known methods in the art, such as CVD or Physical Vapor Deposition (PVD) in the case of metal and silicides. Post deposition, an anisotropic dry etch is used to recess the conducting material such that its top surface is 10 nm to 80 nm below the silicon surface. Finally a non-conformal chemical vapor deposition (CVD) step which deposits a layer of silicon dioxide across the top of the structure, enclosing the conducting rods in the trenches. After the deep trenches 39 with the embedded conductors are formed, the shallower trenches 40 can be etched and filled in a similar manner. A chemical-mechanical planarization (CMP) step then planarizes the silicon dioxide layer and the N– layers 54 and P+ (anode) layers 52 are created in the vertical thyristors, as previously described. The result is illustrated in FIG. 12 with the vertical thyristors surrounded by the isolation regions formed by silicon dioxide surrounding the grounded conducting rods 72 in the deep and shallower (not shown) trenches. Each of the vertical thyristor memory cells are effectively insulated from the others in the array.

Hence the present invention provides for the closer packing of vertical thyristor memory cells in an array. The memory cells remain isolated as the memory cells are moved closer together without electrical interference between the cells. Since air has the lowest dielectric constant of all known materials, thyristor memory cell arrays with trench air gaps can significantly reduce the cross-coupling of neighboring cells and therefore provide a better immunity against electrical disturbance. With the embedded conductor design, on the other hand, electric field lines are either terminated at the conductor or bent away from it and therefore neighboring cell interference is reduced. In addition, the conductor can be either be either electrically floating or biased at a given voltage for better modulation of the thyristor memory cell operations.

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

The invention claimed is:

1. An integrated circuit having an array of vertical thyristor memory cells in a semiconductor substrate, each vertical thyristor memory cell separated from other vertical thyristor memory cells by isolation regions, each isolation region comprising:
   a trench extending parallel to a surface of the semiconductor substrate and separating at least two pairs of vertical memory cells;
   an electrically isolating core in the trench; and
   insulating material enclosing the electrically isolating core in the trench, the insulating material and electrically isolating core occupying an entirety of the trench;
   whereby the isolation region electrically isolates the vertical thyristor memory cell from interference by operations of neighboring memory cells.

2. The integrated circuit of claim 1, wherein the electrically isolating core comprises an air tube along the trench.

3. The integrated circuit of claim 1, wherein the insulating material comprises silicon dioxide.

4. An integrated circuit having a semiconductor substrate, comprising:
   a first thyristor having a vertically stacked P-conductivity type anode, N-conductivity type base, P-conductivity type base, and N-conductivity type cathode provided by the semiconductor substrate;
   a second thyristor having a vertically stacked P-conductivity type anode, N-conductivity type base, P-conductivity type base, and N-conductivity cathode provided by the semiconductor substrate; and
   an isolation region separating the first thyristor from the second thyristor, the isolation region including
   a trench extending into the semiconductor substrate below a junction region between the P-conductivity type base and the N-conductivity cathode of each of the first and second thyristors, the trench extending parallel to a surface of the semiconductor substrate and separating at least two pairs of vertical thyristor memory cells;
   an electrically isolating core; and
   insulating material surrounding the electrically isolating core in the trench, the insulating material and electrically isolating core occupying an entirely of the trench;
   whereby the isolation region electrically isolates the first and second thyristors from interference by operation of the other thyristor.

5. The integrated circuit of claim 4, wherein the electrically isolating core comprises an air tube along the trench.

6. The integrated circuit of claim 4, wherein the insulating material comprises silicon dioxide.

* * * * *